(12) United States Patent
Park et al.

(10) Patent No.: US 11,024,577 B1
(45) Date of Patent: Jun. 1, 2021

(54) EMBEDDED ANTI-FUSES FOR SMALL SCALE APPLICATIONS

(71) Applicant: International Business Machines Corporation, Armonk, NY (US)

(72) Inventors: Chanro Park, Clifton Park, NY (US); Kenneth Chun Kuen Cheng, Albany, NY (US); Koichi Motoyama, Clifton Park, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/746,146

(22) Filed: Jan. 17, 2020

(51) Int. Cl.
  *H01L 23/525* (2006.01)
(52) U.S. Cl.
  CPC ................................ *H01L 23/5252* (2013.01)
(58) Field of Classification Search
  CPC .................................................. H01L 23/5252
  See application file for complete search history.

(56) References Cited

U.S. PATENT DOCUMENTS

| | | | |
|---|---|---|---|
| 6,124,194 A | 9/2000 | Shao et al. | |
| 6,355,555 B1 | 3/2002 | Park | |
| 6,661,094 B2 | 12/2003 | Morrow et al. | |
| 7,023,093 B2 | 4/2006 | Canaperi et al. | |
| 7,402,463 B2 | 7/2008 | Yang et al. | |
| 7,808,105 B1 * | 10/2010 | Paek | H01L 23/3171 257/750 |
| 8,159,042 B2 | 4/2012 | Yang et al. | |
| 8,471,356 B2 | 6/2013 | Cheng et al. | |
| 8,736,020 B2 | 5/2014 | Bao et al. | |
| 9,754,903 B2 | 9/2017 | Patil et al. | |
| 2004/0140558 A1 * | 7/2004 | Tanaka | H01L 23/3114 257/734 |
| 2013/0299940 A1 | 11/2013 | Kurz et al. | |
| 2014/0252608 A1 * | 9/2014 | Chen | H01L 23/481 257/738 |

* cited by examiner

*Primary Examiner* — Peniel M Gumedzoe
(74) *Attorney, Agent, or Firm* — James Nock; Ryan, Mason & Lewis, LLP

(57) ABSTRACT

A method for manufacturing a semiconductor device includes forming first and second interconnect structures on an etch stop layer, wherein the second interconnect structure is spaced apart from the first interconnect structure. The etch stop layer extends between the first and second interconnect structures. In the method, part of the etch stop layer between the first and second interconnect structures is removed. The removing forms a first portion of the etch stop layer extending from under the first interconnect structure toward the second interconnect structure, and a second portion of the etch stop layer extending from under the second interconnect structure toward the first interconnect structure. The first and second portions are spaced apart from each other. A dielectric layer is formed which fills in the spaces between the first and second portions of the etch stop layer and between the first and second interconnect structures.

15 Claims, 18 Drawing Sheets

100

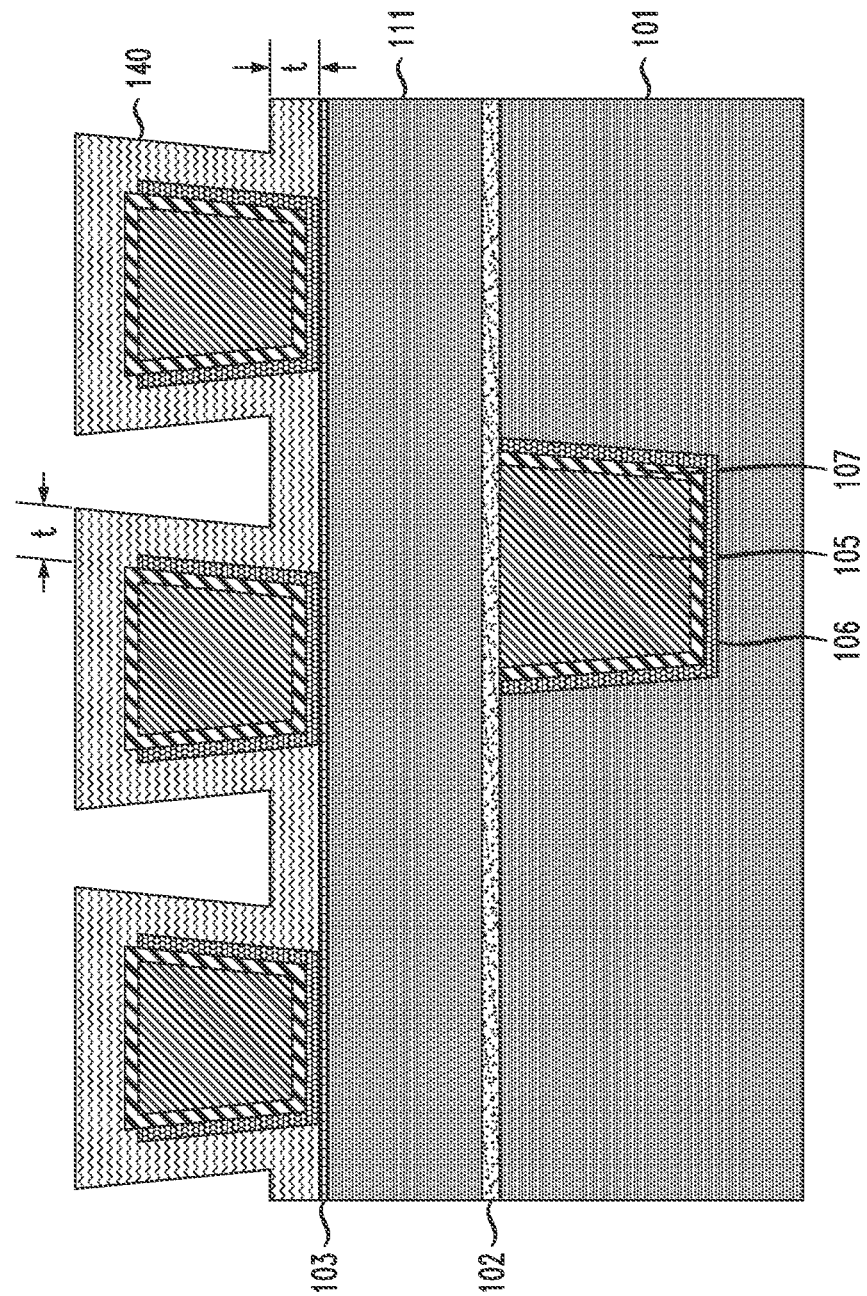

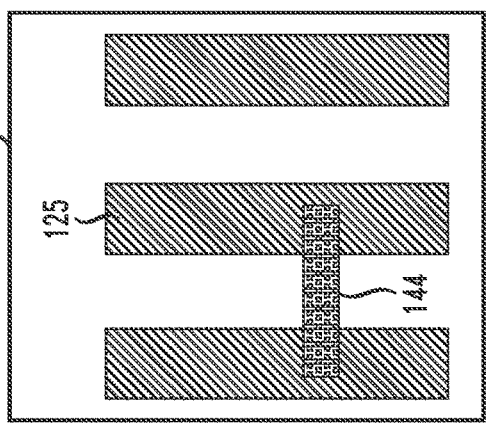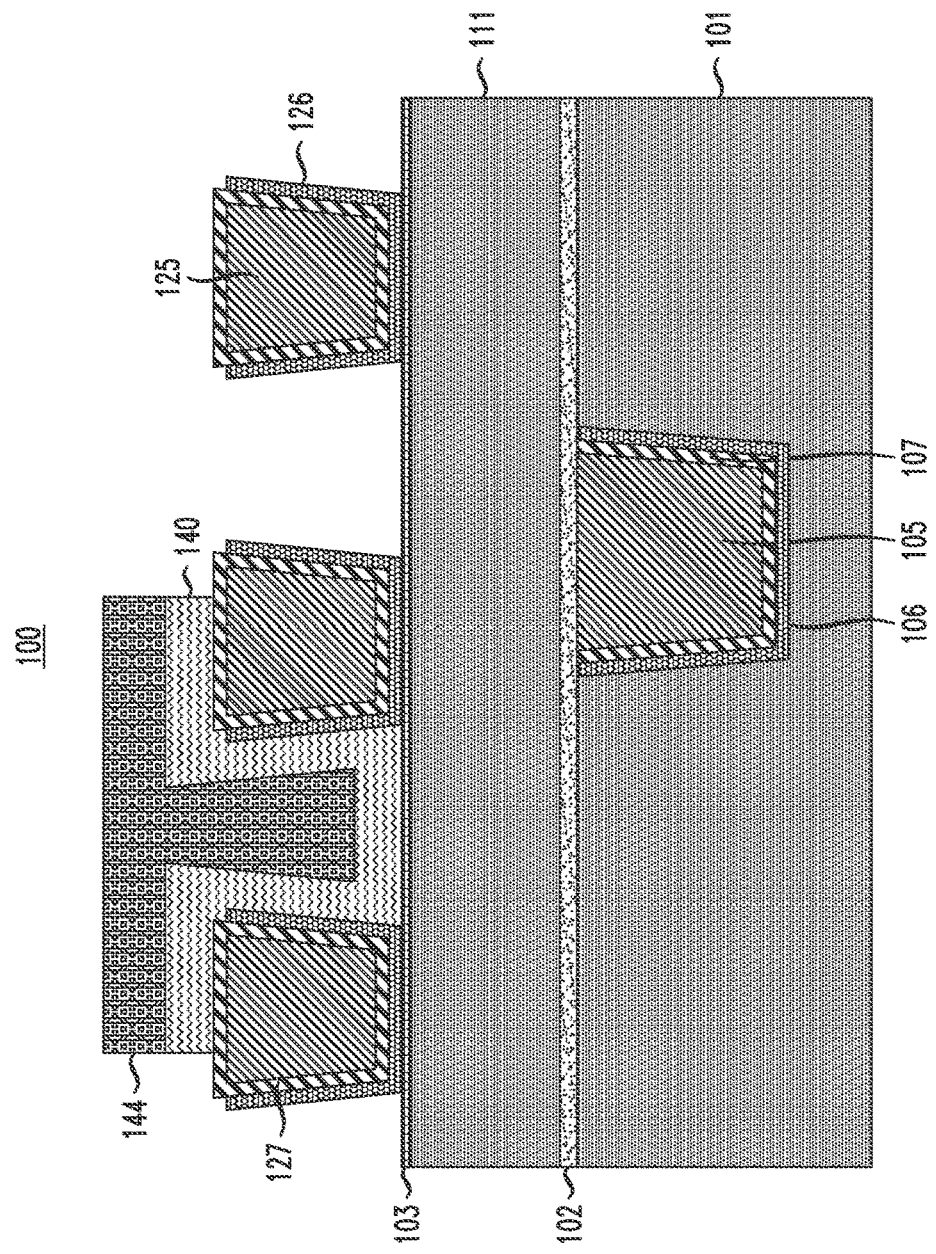

100

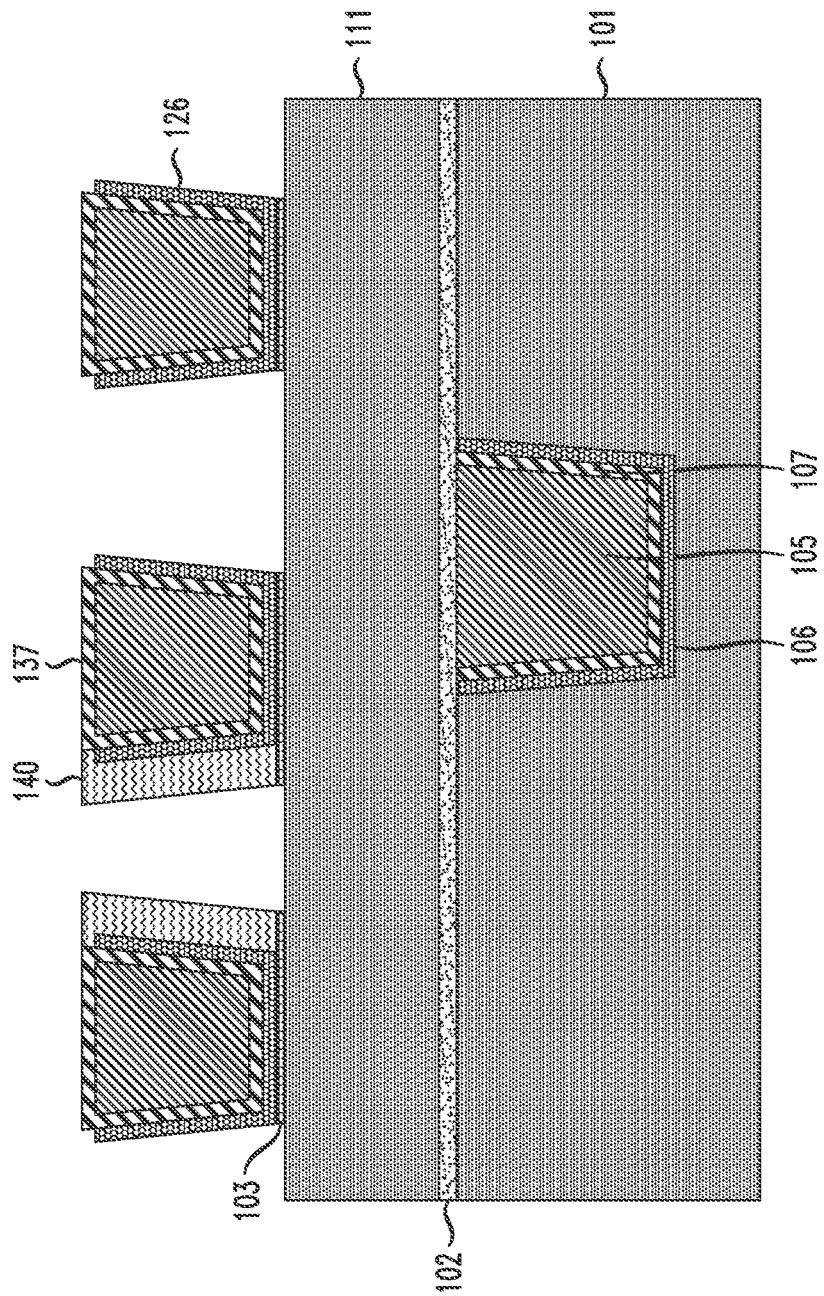

200

EMBEDDED ANTI-FUSES FOR SMALL SCALE APPLICATIONS

BACKGROUND

Anti-fuses are commonly used in the semiconductor industry for one-time programming purposes. For example, anti-fuses can be used for updating and repairing in product configurations, such as repairing memory arrays by swapping defective cells with redundant cells.

Anti-fuse structures include a material which initially has a relatively high resistance, but after programming is converted to a lower resistance material. Programming may be performed by, for example, optical or electrical methods, such as when a voltage across an anti-fuse structure exceeds a certain level. In order to convert to the lower resistance material, known anti-fuses typically require voltages in excess of an on-chip power supply voltage to break down an insulating region between two conductors.

As semiconductor structures are being scaled down and spacing between interconnects is being reduced, anti-fuses are becoming more difficult to fabricate. In addition, conventional anti-fuses are bulky and occupy relatively large amounts of space in an integrated circuit, reducing the amount of available space for interconnect metal wires and other components in a circuit.

SUMMARY

According to an exemplary embodiment of the present invention, a method for manufacturing a semiconductor device includes forming first and second interconnect structures on an etch stop layer, wherein the second interconnect structure is spaced apart from the first interconnect structure. The etch stop layer extends between the first and second interconnect structures. In the method, part of the etch stop layer between the first and second interconnect structures is removed. The removing forms a first portion of the etch stop layer extending from under the first interconnect structure toward the second interconnect structure, and a second portion of the etch stop layer extending from under the second interconnect structure toward the first interconnect structure. The first and second portions are spaced apart from each other. A dielectric layer is formed which fills in the spaces between the first and second portions of the etch stop layer and between the first and second interconnect structures.

According to an exemplary embodiment of the present invention, a semiconductor device includes a first conductive layer disposed on a first dielectric layer, and a second conductive layer disposed on the first dielectric layer, wherein the second conductive layer is spaced apart from the first conductive layer. First and second interconnect structures are disposed on the first and second conductive layers, respectively, and the first and second interconnect structures are spaced apart from each other. The first conductive layer includes an end at a first position on the first dielectric layer between the first and second interconnect structures, and the second conductive layer includes an end at a second position on the first dielectric layer between the first and second interconnect structures. The ends of the first and second conductive layers are spaced apart from and face each other. The semiconductor device also includes a second dielectric layer filling in the space between the ends of the first and second conductive layers and the space between the first and second interconnect structures.

According to an exemplary embodiment of the present invention, a method for manufacturing a semiconductor device includes forming first and second interconnect structures on a conductive layer, wherein the second interconnect structure is spaced apart from the first interconnect structure. The conductive layer extends between the first and second interconnect structures. In the method, part of the conductive layer between the first and second interconnect structures is removed. The removing forms a first portion of the conductive layer extending from under the first interconnect structure toward the second interconnect structure, and a second portion of the conductive layer extending from under the second interconnect structure toward the first interconnect structure. The first and second portions are spaced apart from each other. A dielectric layer is formed which fills in the spaces between the first and second portions of the conductive layer and between the first and second interconnect structures.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which:

FIG. 5 is a cross-sectional view illustrating fabrication of a semiconductor device, and showing dielectric layer removal and sacrificial spacer layer formation, according to an exemplary embodiment of the present invention.

FIG. 6A is a cross-sectional view illustrating fabrication of a semiconductor device, and showing spacer block mask formation and removal of exposed portions of the sacrificial spacer layer, according to an exemplary embodiment of the present invention.

FIG. 6B is a top view illustrating fabrication of a semiconductor device, and showing spacer block mask formation and removal of exposed portions of the sacrificial spacer layer, according to an exemplary embodiment of the present invention.

FIG. 8 is a cross-sectional view illustrating fabrication of a semiconductor device, and showing removal of exposed portions of the etch stop layer, according to an exemplary embodiment of the present invention.

DETAILED DESCRIPTION

Figure 1:
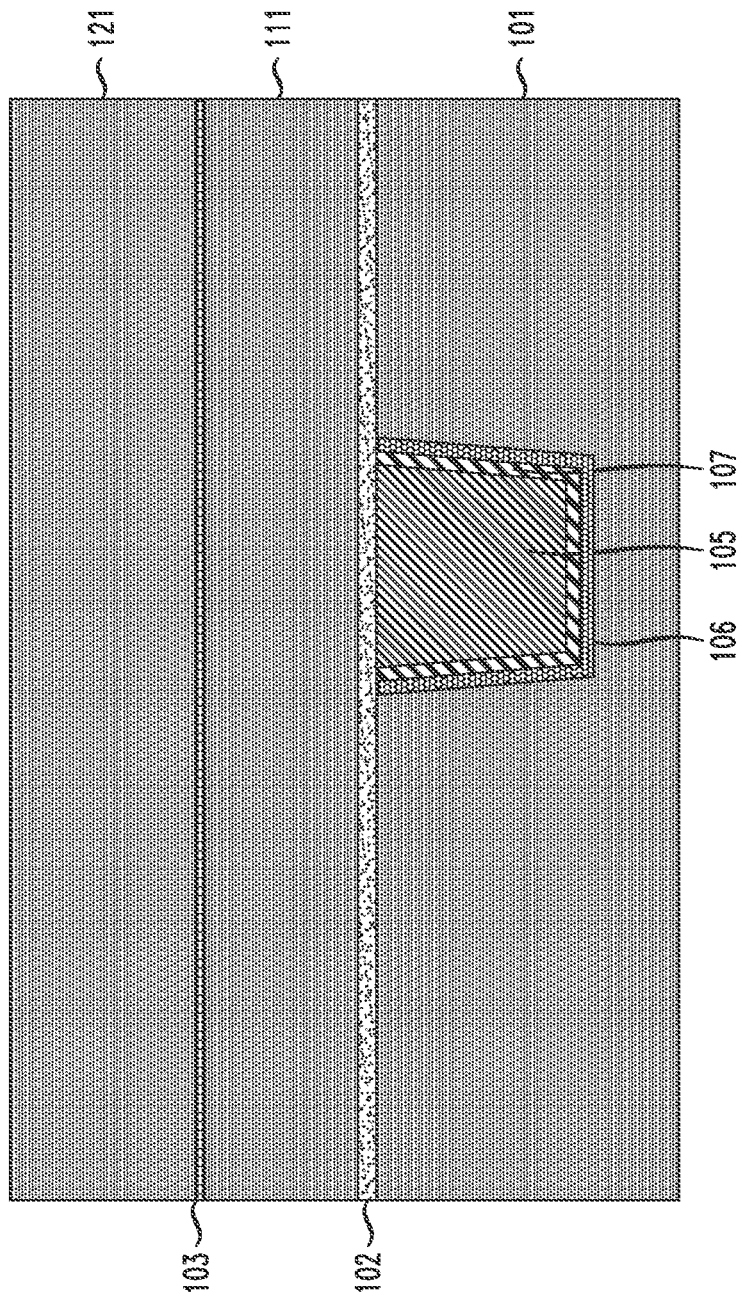
FIG. 1 is a cross-sectional view illustrating fabrication of a semiconductor device, and showing dielectric layer and etch stop layer formation, according to an exemplary embodiment of the present invention.

Exemplary embodiments of the invention will now be discussed in further detail with regard to semiconductor devices and methods of manufacturing same and, in particular, to an anti-fuse structure including two metal portions that extend laterally from neighboring wires.

It is to be understood that the various layers and/or regions shown in the accompanying drawings are not drawn to scale, and that one or more layers and/or regions of a type commonly used in, for example, complementary metal-oxide semiconductor (CMOS), fin field-effect transistor (FinFET), metal-oxide-semiconductor field-effect transistor (MOSFET), programmable logic devices (PLDs), programmable gate arrays, programmable read-only memory (PROM) devices, including, but not limited to, erasable programmable read-only memories (EPROMS), electronically erasable programmable read-only memories (EE-PROMS), and/or other semiconductor devices in which anti-fuses may be used, may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not necessarily be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, CMOSs, MOSFETs, FinFETs, PLDs, programmable gate arrays, PROMS, EPROMS, and/or EEPROMS. By way of non-limiting example, the semiconductor devices can include, but are not necessarily limited to CMOS, MOSFET, FinFET, PLD, programmable gate array, PROM, EPROM, and/or EEPROM devices, and/or semiconductor devices that use CMOS, MOSFET, FinFET, PLD, programmable gate array, PROM, EPROM, and/or EEPROM technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

There is a need for anti-fuse structures for smaller scale semiconductor devices, and methods of manufacturing same. In accordance with the embodiments, an anti-fuse structure includes two metal portions that respectively extend laterally from adjacent metal wires. The metal portions are embedded in a dielectric layer between the adjacent metal wires, and face each other with a space between their ends. Upon application of a voltage exceeding a particular level or of some other programming technique, the portion of the dielectric layer between the opposing ends of electrically conductive material breaks down to form an anti-fuse. Since the anti-fuse is embedded in a dielectric layer between two wires, and the anti-fuse occupies less space than conventional structures. According to one or more embodiments, the embedded anti-fuse can be integrated into interconnects with sub-15 nm spacing between them, and the spacing between the opposing ends of the metal portions can be precisely controlled.

As used herein, "low-k" refers to dielectric materials having a relative dielectric constant less than 7, and includes ultra-low-k dielectric materials.

As used herein, "high-k" refers to dielectric materials having a relative dielectric constant greater than 7.

Referring to FIG. 1, a semiconductor device 100 includes an interconnect formed in a first dielectric layer 101. The interconnect includes a barrier layer 106 and liner layer 107 formed on the barrier layer 106. A fill layer 105 is formed on the liner layer 107. The barrier layer 106 includes, for example, titanium nitride, tantalum nitride or tungsten nitride and is conformally formed on sidewalls and a bottom surface of a trench in the first dielectric layer 101. The liner layer 107 includes, for example, cobalt and/or ruthenium and is conformally formed on the barrier layer 106. The fill layer 105 includes, an electrically conductive metal, such as, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides or combinations thereof. The interconnect and the first dielectric layer 101 can form at least part of a lower metallization level ($M_x$).

Interconnects, also referred to herein as wires or conductive lines, function as conductive contacts. Interconnects form electrical connections between elements and/or devices, or form contacts to elements or devices. As used herein, an "interconnect" or "interconnect structure" includes a conductive fill layer, and may further include a barrier layer, liner layer and/or a cap layer.

The first dielectric layer 101 includes, for example, silicon dioxide ($SiO_2$), carbon-doped silicon oxide (SiCOH), SiLK® dielectrics, porous forms of these low-k dielectric films, flowable dielectrics and/or spin-on dielectrics. As can be understood by one of ordinary skill in the art, the dielectric layer 101 can be on a semiconductor substrate (not shown), with intervening layers (e.g., lower conductive lines, devices, etc.) between the dielectric layer 101 and the substrate. A semiconductor substrate may comprise semiconductor material including, but not limited to, Si, SiGe, SiC, SiGeC or other like semiconductor. In addition, multiple layers of the semiconductor materials can be used as the semiconductor material of the substrate. A plurality of devices can be on the substrate, such as, for example, transistors, capacitors, and resistors.

A dielectric capping layer 102 comprising, for example, NBLoK™ material or a nitride material (e.g., silicon carbonitride (SiCN)), is formed on the first dielectric layer 101. NBLoK™ material is from Applied Materials, Inc. of Santa Clara, Calif., and is a nitrogen-doped silicon carbide.

A second dielectric layer 111 is formed on the dielectric capping layer 102, and comprises, for example, the same material as or a similar material to the first dielectric layer 101. The second dielectric layer 111 is deposited using one or more deposition techniques, such as, but not necessarily limited to, physical vapor deposition (PVD), chemical vapor deposition (CVD), atomic layer deposition (ALD), plasma-enhanced CVD (PECVD), radio frequency CVD (RFCVD), molecular layer deposition (MLD), molecular beam deposition (MBD), liquid source misted chemical deposition (LSMCD) and/or sputtering.

An etch stop layer 103 is deposited on the second dielectric layer 111. The etch stop layer 103 includes for example, an electrically conductive metal material such as, but not necessarily limited to, tantalum (Ta), tantalum nitride (TaN), Ta/TaN, Ta/Ruthenium (Ru), Ta/Cobalt (Co), TaN/Ru, TaN/Co, Ta/TaN/Ru, and/or Ta/TaN/Co. The etch stop layer 103 is deposited using deposition techniques such as, but not necessarily limited to, PVD, CVD, ALD, PECVD, RFCVD, MLD, MBD, LSMCD, and/or sputtering.

A third dielectric layer 121 is deposited on the etch stop layer 103. According to an embodiment, the third dielectric layer 121 comprises the same or similar material as that of the first and second dielectric layers 101 and 111, as long as the third dielectric layer 121 is able to be selectively etched with respect to the etch stop layer 103. The third dielectric layer 121 is deposited using, for example, PVD, CVD, ALD, PECVD, RFCVD, MLD, MBD, LSMCD, and/or sputtering. The etch stop layer 103 permits complete removal of the third dielectric layer 121 down to the etch stop layer 103, which permits formation of trenches in the dielectric layer 121 having each having bottom surfaces level with each other such that the trenches have the same depth.

Figure 2:
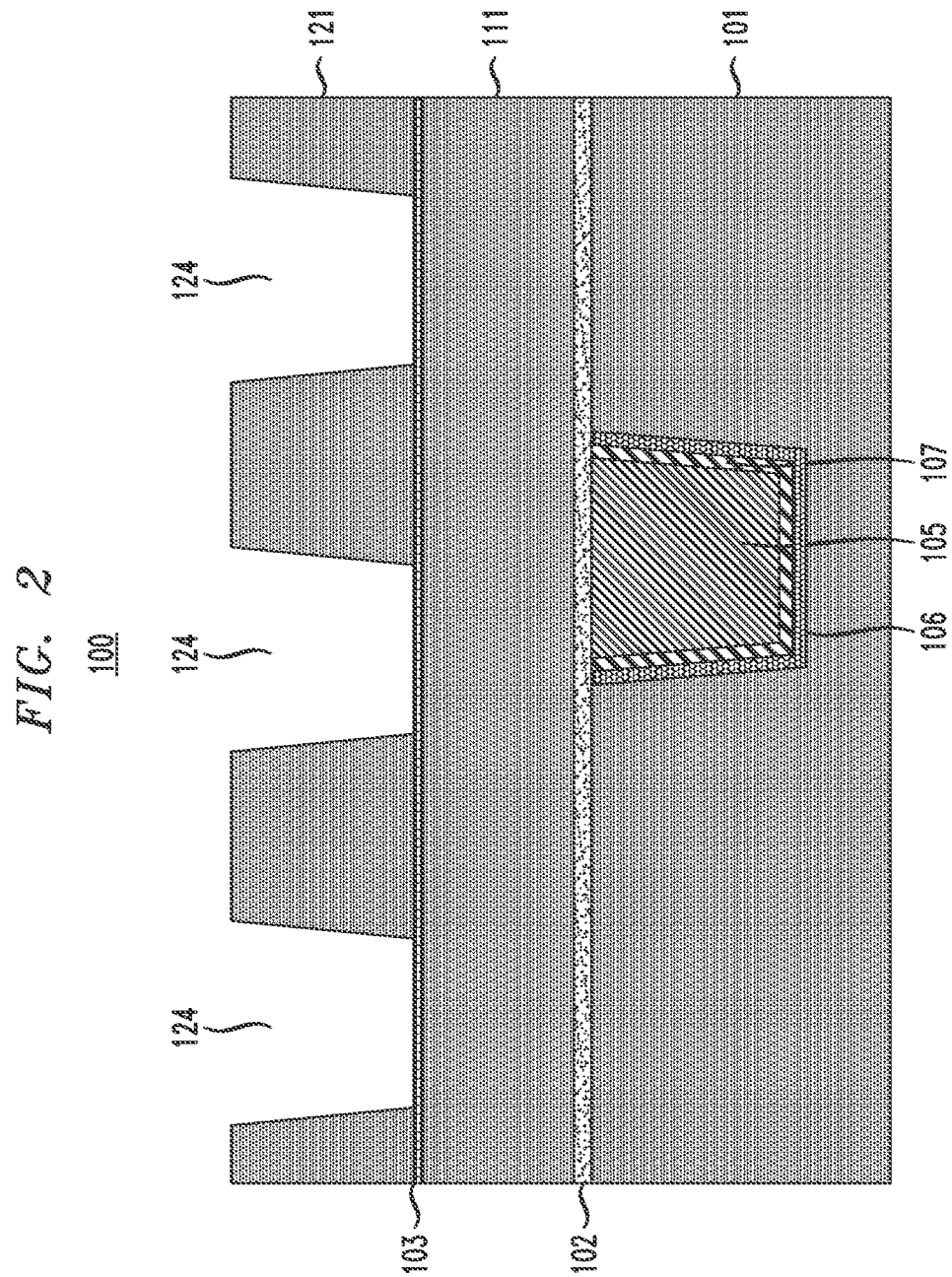
FIG. 2 is a cross-sectional view illustrating fabrication of a semiconductor device, and showing trench formation in a dielectric layer, according to an exemplary embodiment of the present invention.

For example, referring to FIG. 2, portions of the third dielectric layer 121 (e.g., portions not covered by a mask) are etched down to the etch stop layer 103 to form trenches 124 having the same depth. Since the etch stop layer 103 is not etched by the etchant used to remove the dielectric layer 121 or, at the very least, is etched at a very slow rate with respect to that of the dielectric layer 121, the exposed portion of the dielectric layer 121 can be completely removed to form the trenches 124. For example, a representative selectivity ratio of the etch rate of the dielectric layer 121 with respect to that of the etch stop layer 103 would be approximately 5:1. Due to the etch stop layer 103, as shown in FIG. 2, trenches 124 having a uniform depth are formed. According to an embodiment, the etching is performed using, for example, a fluorocarbon based dry etch process or an ultra-violet (UV) damage and wet etch process.

Figure 3:
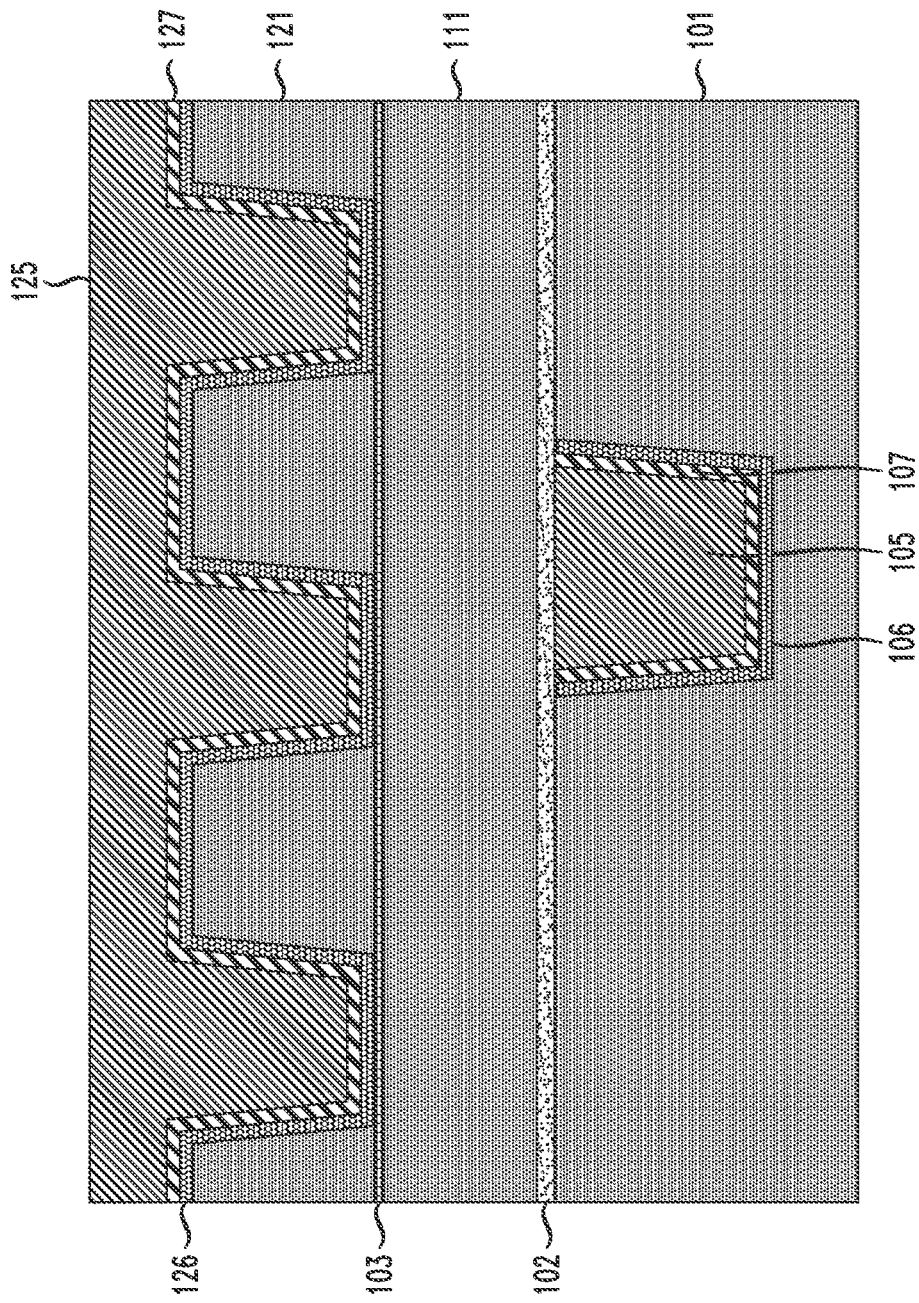
FIG. 3 is a cross-sectional view illustrating fabrication of a semiconductor, and showing formation of barrier, liner and conductive fill layers, according to an exemplary embodiment of the present invention.

Referring to FIG. 3, the trenches 124 are lined with barrier and liner layers 126 and 127 the same as or similar to barrier and liner layers 106 and 107, and filled with conductive fill layers 125, similar to fill layer 105. For example, the fill, barrier and liner layers 125, 126 and 127 can have the same material as or similar material to the fill, barrier and liner layers 105, 106 and 107.

The barrier and liner layers 126 and 127 are conformally formed on a top surface of the dielectric layer 121, and on sidewalls and bottom surfaces of the trenches 124, including exposed surfaces of the etch stop layer 103 and dielectric layer 121. The barrier and liner layers 126 and 127 are deposited using, for example, a conformal deposition technique, such as ALD or CVD. The fill layer 125 is deposited on the liner layer 127 using deposition techniques, including, but not necessarily limited to, PVD, CVD, ALD or sputtering.

Figure 4:
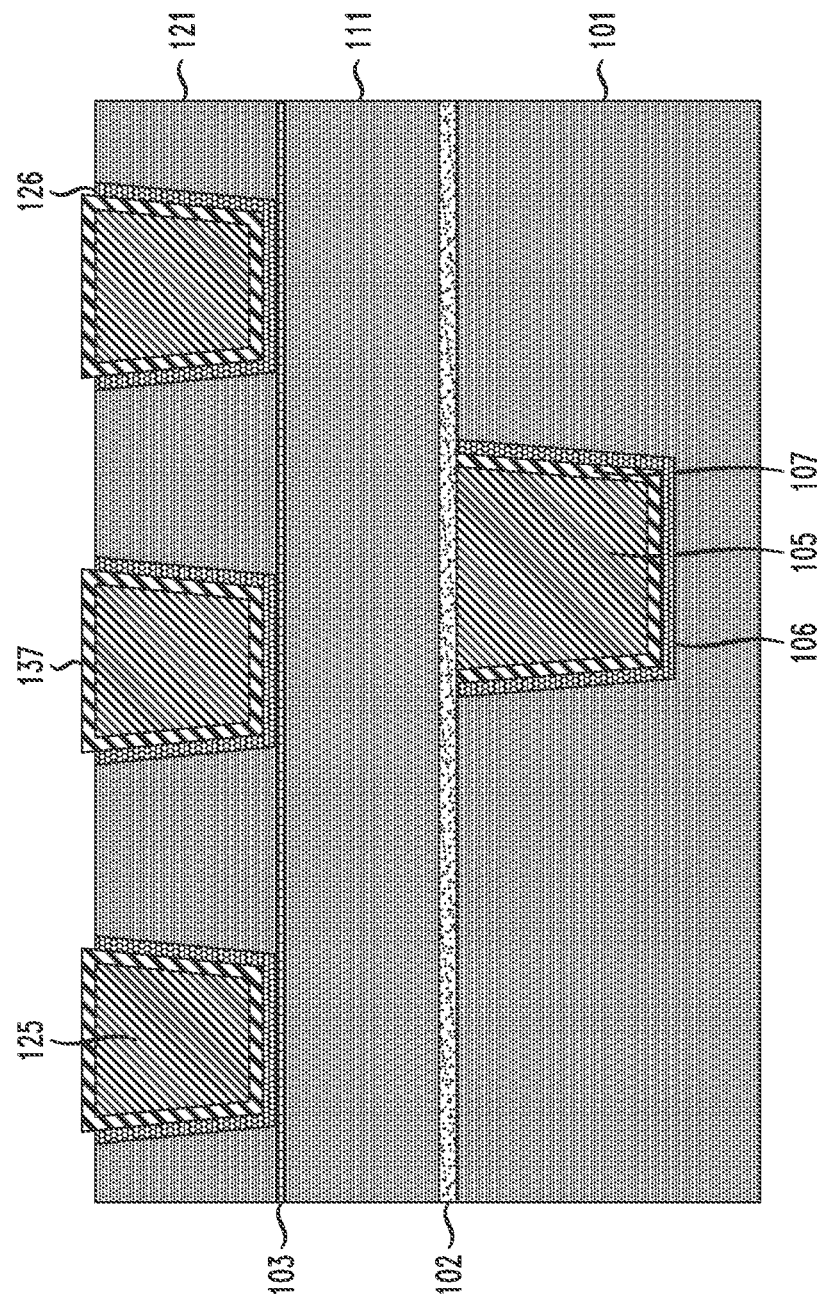
FIG. 4 is a cross-sectional view illustrating fabrication of a semiconductor device, and showing planarization and cap layer formation, according to an exemplary embodiment of the present invention.

Referring to FIG. 4, following deposition of the fill layer 125, a planarization process, such as, for example, chemical mechanical polishing (CMP), is performed to remove portions of the fill, barrier and liner layers 125, 126 and 127 on the top surface of the dielectric layer 121 and extending out of the trenches 124 to planarize an upper surface of the device.

Following planarization, cap layers 137 including the same material as or material similar to the liner layers 107 and 127 (e.g., Co and/or Ru), are selectively deposited on the top surfaces of the fill and liner layers 125 and 127. The cap layers are deposited using, for example, area-selective deposition techniques including, but not necessarily limited to, CVD.

Referring to FIG. 5, following deposition of the cap layers 137, remaining portions of the dielectric layer 121 are removed using the same or a similar etch process as that described in connection with the removal of portions of the dielectric layer 121 to form the trenches 124. The removal of the remaining portions of the dielectric layer 121 exposes portions of the etch stop layer 103 that were under the dielectric layer 121. Following etching of the dielectric layer 121, a sacrificial spacer layer 140 is conformally deposited on the exposed portions of the etch stop layer 103, and on sides and top surfaces of the interconnect structures including the fill, barrier, liner and cap layers 125, 126, 127 and 137. The conformal deposition process includes, for example, ALD or CVD. The material of the sacrificial spacer layer 140 includes, but is not necessarily limited to, titanium oxide ($TiO_x$), titanium nitride (TiN), silicon nitride (SiN), silicon carbon nitride (SiCN) and/or $SiO_2$. The thickness t of the spacer layer 140 can be precisely controlled. For example, according to embodiments, the thickness of the sacrificial spacer layer 140 is about 0.1 to less than about 0.5 of the distance between adjacent metal wires (e.g., interconnect structures including the fill, barrier, liner and cap layers 125, 126, 127 and 137), but the embodiments are not necessarily limited thereto. As described in more detail in connection with FIGS. 7-10, the thickness of the sacrificial spacer layer 140, which masks portions of the etch stop layer 103 during etching of the etch stop layer 103, controls resulting spacing between remaining portions of the etch stop layer 103, which form the two metal portions of the anti-fuse structure. The two metal portions respectively extend laterally from adjacent metal wires.

Referring to FIGS. 6A and 6B, a spacer block mask 144 is formed on a portion of the sacrificial spacer layer 140 between two neighboring interconnect structures and on top of part of the two interconnect structures. The spacer block mask 144 comprises, for example, an organic planarization layer (OPL) material. The OPL material comprises, but is not necessarily limited to, an organic polymer including C, H, and N. In an embodiment, the OPL material can be free of silicon (Si). According to an embodiment, the OPL material can be free of Si and fluorine (F). As defined herein, a material is free of an atomic element when the level of the atomic element in the material is at or below a trace level detectable with analytic methods available in the art. Non-limiting examples of the OPL material include JSR HM8006, JSR HM8014, AZ UM10M2, Shin Etsu ODL 102, or other similar commercially available materials from such vendors as JSR, TOK, Sumitomo, Rohm & Haas, etc. The spacer block mask 144 can be deposited, for example, by spin coating.

Following deposition of the spacer block mask 144, exposed portions of the sacrificial spacer layer 140 not covered by the spacer block mask 144 are removed, leaving exposed portions of the etch stop layer 103, and portions of the barrier and cap layers 126 and 137 as shown in FIG. 6B. The removal of the exposed portions sacrificial spacer layer 140 not masked by the spacer block mask 144 can be performed using, for example, a chlorine-based etch for a sacrificial spacer layer 140 comprising TiN, or a fluorocarbon-based etch for a sacrificial spacer layer 140 comprising $SiO_2$. FIG. 6A is a simplified top view showing the orientation of the conductive fill layers 125 and the overlying spacer block mask 144. As can be understood, FIG. 6A omits certain elements for ease of explanation.

Figure 7:
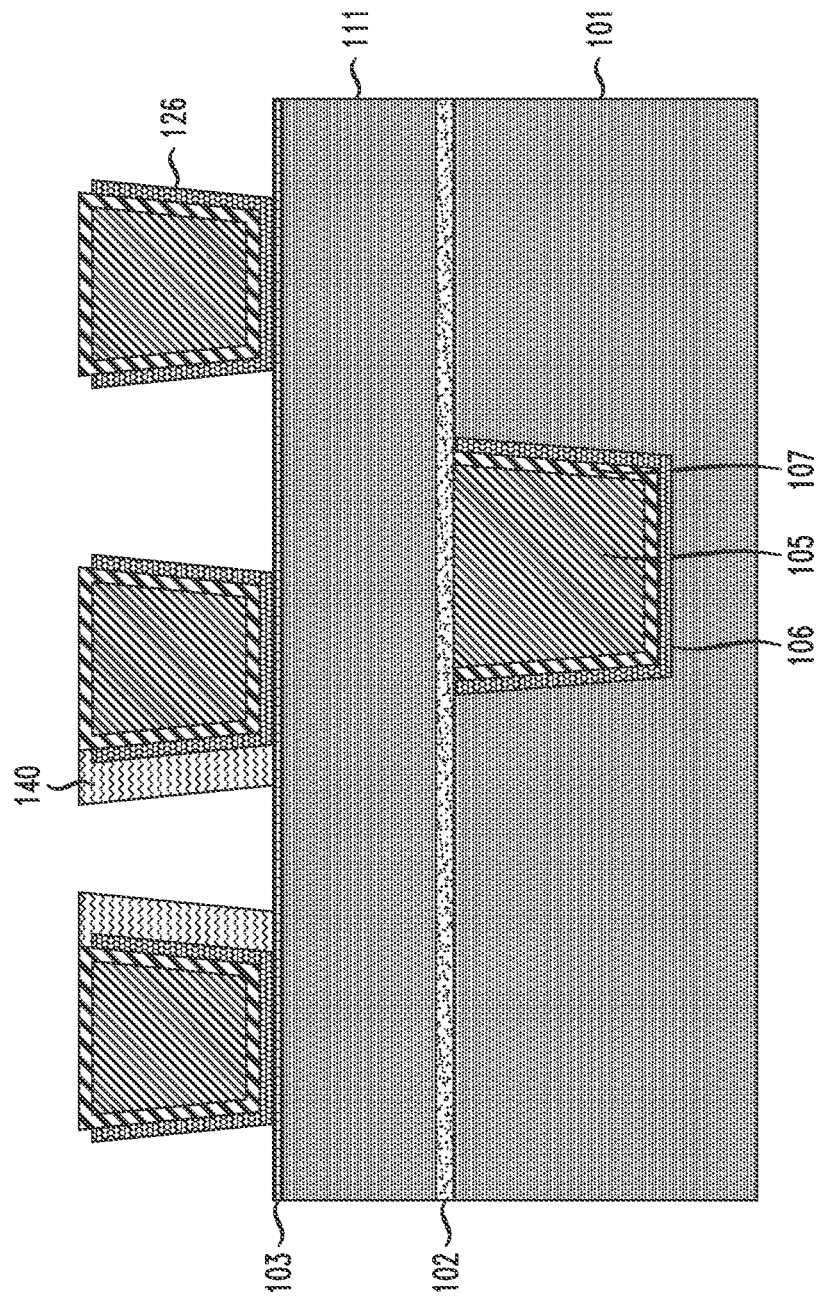
FIG. 7 is a cross-sectional view illustrating fabrication of a semiconductor device, and showing spacer block mask removal, and removal of portions of the sacrificial spacer layer, according to an exemplary embodiment of the present invention.

Referring to FIG. 7, the spacer block mask 144 is removed, and horizontal portions of the sacrificial spacer layer 140 are removed. The spacer block mask 144, which includes OPL material, is removed using, for example, oxygen plasma, nitrogen plasma, hydrogen plasma or other carbon strip or ashing process. Following removal of the spacer block mask 144, horizontal portions of the sacrificial spacer layer 140 are removed in a directional etching process using, for example, a dry etch process, such as a fluorocarbon-based etch. As can be seen in FIG. 7, the remaining portions of the sacrificial spacer layer 140 not removed by the directional etching cover parts of the etch stop layer 103 extending from and located between two neighboring interconnect structures (metal lines).

Figure 9B:
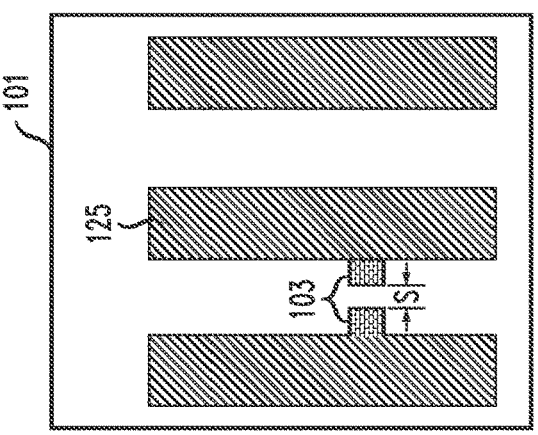
FIG. 9B is a top view illustrating fabrication of a semiconductor device, and showing removal of remaining portions of the sacrificial spacer layer, according to an exemplary embodiment of the present invention.
Figure 9A:
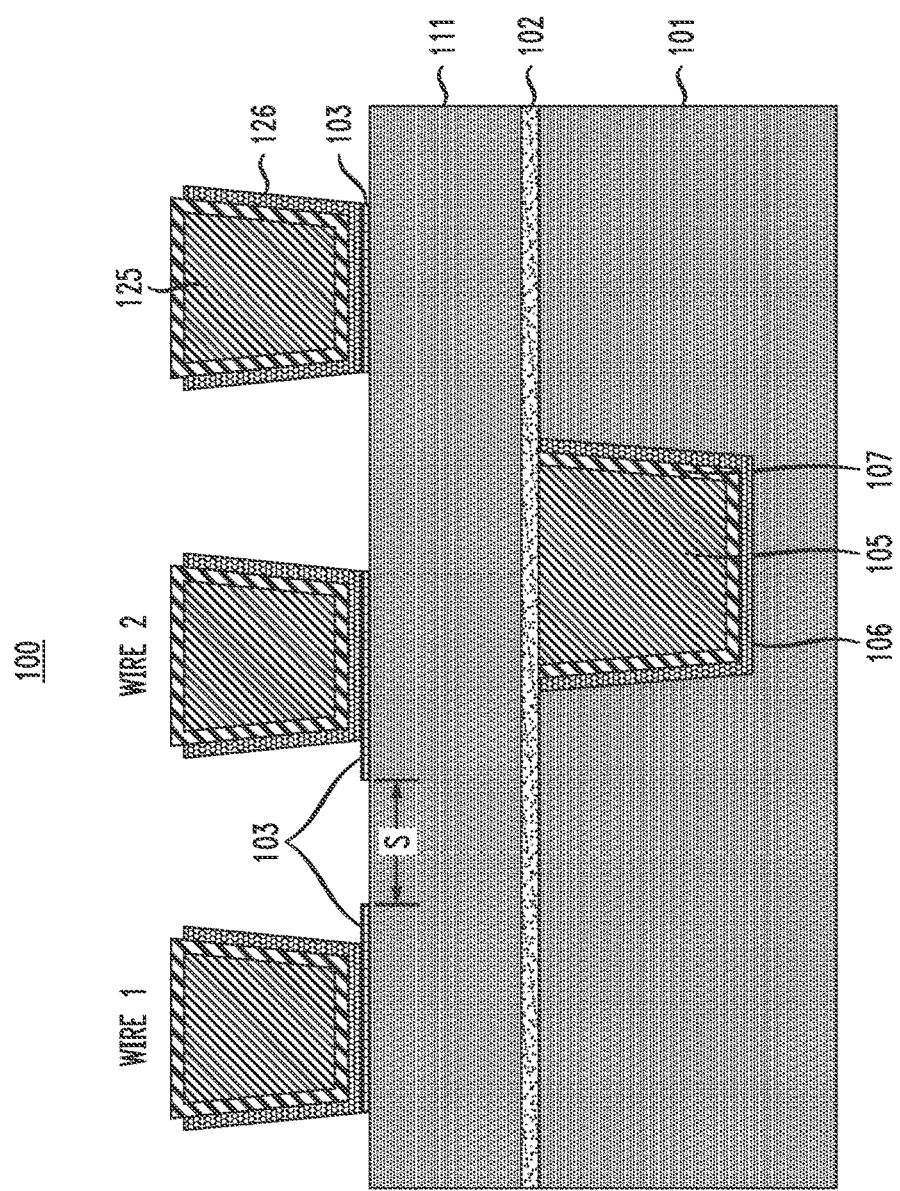
FIG. 9A is a cross-sectional view illustrating fabrication of a semiconductor device, and showing removal of remaining portions of the sacrificial spacer layer, according to an exemplary embodiment of the present invention.

Referring to FIG. 8, exposed portions of the etch stop layer 103 are removed using, for example, a directional etching process with a chlorine-based plasma. The portions of the etch stop layer 103 covered by the remaining portions of the sacrificial spacer layer 140, and under the interconnect structures are not removed. Then, referring to FIGS. 9A and 9B, the remaining portions of the sacrificial spacer layer 140 are removed using, for example, a chlorine-based etch for a sacrificial spacer layer 140 comprising TiN, or a fluorocarbon-based etch for a sacrificial spacer layer 140 comprising $SiO_2$. The remaining portions of the etch stop layer 103 extending between the interconnect structures Wire 1 and Wire 2 form the two metal portions of the anti-fuse structure. The two metal portions (extending portions of the etch stop layer 103) respectively extend laterally from adjacent metal wires Wire 1 and Wire 2. The thickness t of the sacrificial spacer layer 140 controls resulting spacing S between the extending portions of the etch stop layer 103. For example, if the distance between the adjacent metal wires Wire 1 and Wire 2 is 10 nm, and a thickness of the sacrificial spacer layer is 3 nm, then each extending portion of the etch stop layer 103 would be 3 nm, with a space S of 4 nm between the extending portions of the etch stop layer 103. FIG. 9A is a simplified top view showing the orientation of the conductive fill layers 125 and the extending portions of the etch stop layer 103. As can be understood, FIG. 9A omits certain elements for ease of explanation.

Figure 10:
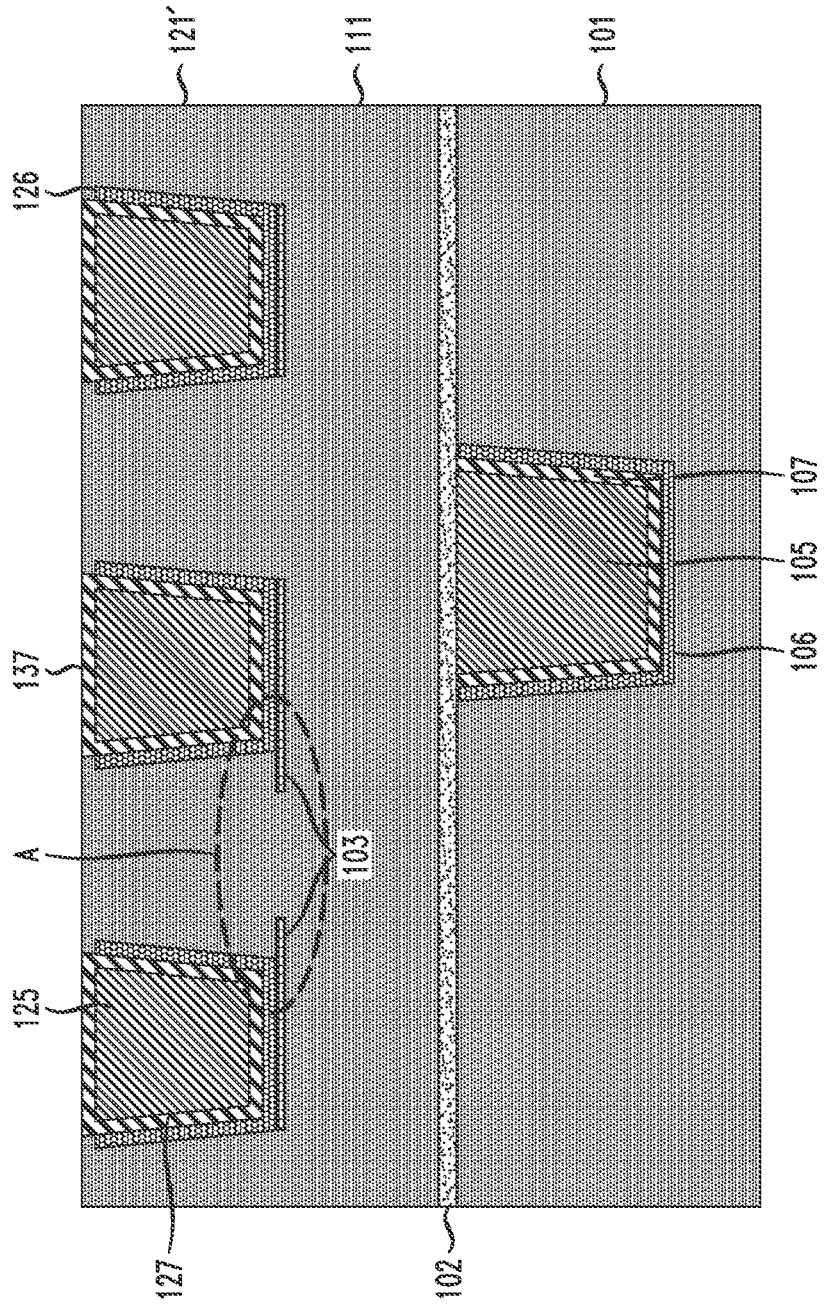
FIG. 10 is a cross-sectional view illustrating fabrication of a semiconductor device, and showing dielectric layer formation and planarization, according to an exemplary embodiment of the present invention.

Referring to FIG. 10, a dielectric layer 121' is formed on the dielectric layer 111 to replace the removed dielectric layer 121 and fills in gaps between the interconnect structures including the fill, barrier, liner and cap layers 125, 126, 127 and 137, and remaining portions of the etch stop layer 103. According to an embodiment, the dielectric layer 121' comprises the same or similar material as that of the dielectric layers 101, 111 and 121. The dielectric layer 121' is deposited using, for example, PVD, CVD, ALD, PECVD, RFCVD, MLD, MBD, LSMCD, and/or sputtering, followed by a planarization, such as, for example, CMP to planarize the dielectric layer 121' with the cap layers 137.

As shown by the circled portion A, the extending portions of the etch stop layer 103, which face each other with the space S between their ends, function as the point where an anti-fuse is prone to be formed. For example, upon application a threshold voltage, the portion of the dielectric layer 121' between the ends of the extending portions of the etch stop layer 103 breaks down to form an electrically conductive path between the adjacent interconnect structures Wire 1 and Wire 2. The three interconnects surrounded by the dielectric layer 121' and the dielectric layer 121' can form at least part of an upper metallization level ($M_{x+1}$).

Figure 11:
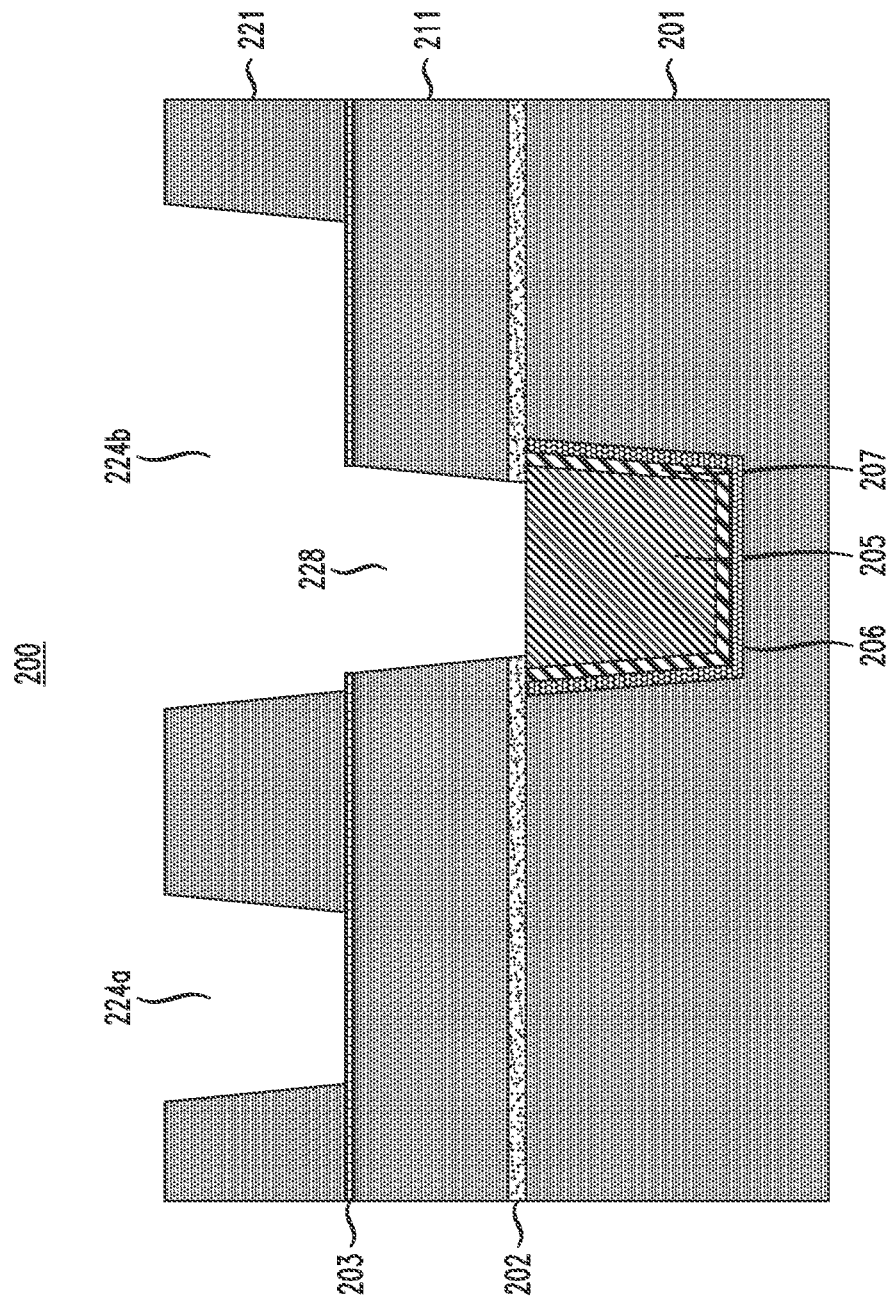
FIG. 11 is a cross-sectional view illustrating fabrication of a semiconductor device, and showing upper level metallization trench and via opening formation in a dielectric layer, according to an exemplary embodiment of the present invention.

Referring to FIG. 11, a semiconductor device 200 includes an interconnect formed in a first dielectric layer 201. The interconnect includes a barrier layer 206 and liner layer 207 formed on the barrier layer 206. A fill layer 205 is formed on the liner layer 207. The barrier layer 206 includes, for example, titanium nitride, tantalum nitride or tungsten nitride and is conformally formed on sidewalls and a bottom surface of a trench in the first dielectric layer 201. The liner layer 207 includes, for example, cobalt and/or ruthenium and is conformally formed on the barrier layer 206. The fill layer 205 includes, an electrically conductive metal, such as, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides or combinations thereof. The interconnect and the first dielectric layer 201 can form at least part of a lower metallization level ($M_x$).

The first dielectric layer 201 includes, for example, $SiO_2$, SiCOH, SiLK® dielectrics, porous forms of these low-k dielectric films, flowable dielectrics and/or spin-on dielectrics. As can be understood by one of ordinary skill in the art, the dielectric layer 201 can be on a semiconductor substrate (not shown), with intervening layers (e.g., lower conductive lines, devices, etc.) between the dielectric layer 201 and the substrate.

A dielectric capping layer 202 comprising, for example, NBLoK™ material or a nitride material (e.g., SiCN), is formed on the first dielectric layer 201. A second dielectric layer 211 is formed on the dielectric capping layer 202, and comprises, for example, the same material as or a similar material to the first dielectric layer 201. The second dielectric layer 211 is deposited using one or more deposition techniques, such as, but not necessarily limited to, PVD, CVD, ALD, PECVD, RFCVD, MLD, MBD, LSMCD and/or sputtering.

An etch stop layer 203 is deposited on the second dielectric layer 211. The etch stop layer 203 includes for example, an electrically conductive metal material such as, but not necessarily limited to, tantalum (Ta), tantalum nitride (TaN), Ta/TaN, Ta/Ruthenium (Ru), Ta/Cobalt (Co), TaN/Ru, TaN/Co, Ta/TaN/Ru, and/or Ta/TaN/Co. The etch stop layer 203 is deposited using deposition techniques such as, but not necessarily limited to, PVD, CVD, ALD, PECVD, RFCVD, MLD, MBD, LSMCD, and/or sputtering.

A third dielectric layer 221 is deposited on the etch stop layer 203. According to an embodiment, the third dielectric layer 221 comprises the same or similar material as that of the first and second dielectric layers 201 and 211, as long as the third dielectric layer 221 is able to be selectively etched with respect to the etch stop layer 203. The third dielectric layer 221 is deposited using, for example, PVD, CVD, ALD, PECVD, RFCVD, MLD, MBD, LSMCD, and/or sputtering. The etch stop layer 203 permits complete removal of the third dielectric layer 221 down to the etch stop layer 103, which permits formation of trenches in the dielectric layer 221 having each having the same depth.

For example, portions of the third dielectric layer 221 (e.g., portions not covered by a mask) are etched down to the etch stop layer 203 to form trenches 224a and 224b having the same depth. Since the etch stop layer 203 is not etched by the etchant used to remove the dielectric layer 221 or, at the very least, is etched at a very slow rate with respect to that of the dielectric layer 221, the exposed portion of the dielectric layer 221 can be completely removed to form the trenches 224a and 224b. For example, a representative selectivity ratio of the etch rate of the dielectric layer 221 with respect to that of the etch stop layer 203 would be approximately 5:1. Due to the etch stop layer 203, trenches 224a and 224b having a uniform depth are formed. According to an embodiment, the etching is performed using, for example, a fluorocarbon based dry etch process or an ultra-violet (UV) damage and wet etch process.

In addition, a via opening 228 under the trench 224b is formed in the dielectric layer 211. The via opening 228 is formed by removing a portion of the etch stop layer 203 and removing a portion of the dielectric layer 211 and the capping layer 202. The portion of the etch stop layer 203 is removed using, for example, an etch process with a fluorine-based plasma or a chlorine-based plasma, and the portion of the capping layer 202 is removed using, for example, an etch process with a fluorine-based plasma. Etching of the dielectric layer 211 is performed using, for example, a process similar to that to remove the dielectric layer 221. The via opening 228 exposes a top surface of the fill layer 205.

Figure 12:
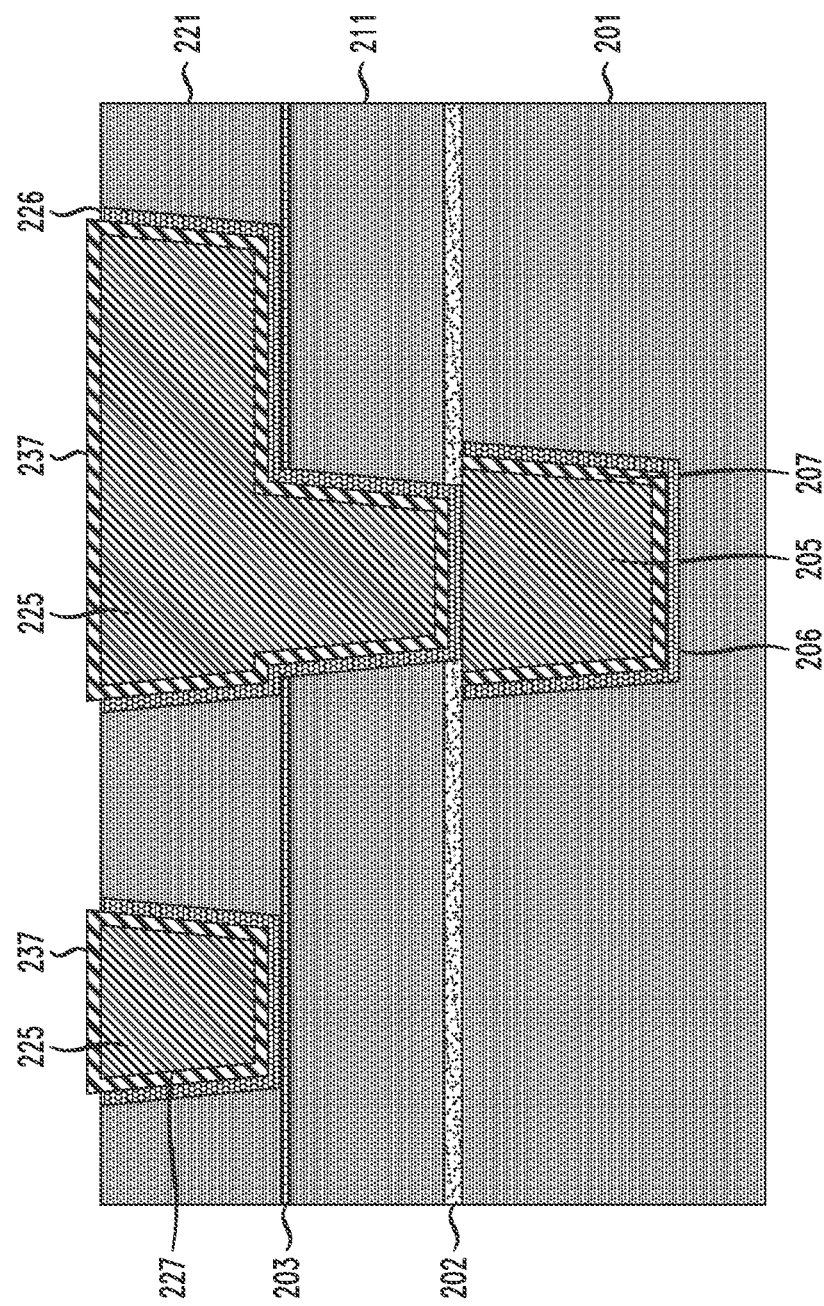
FIG. 12 is a cross-sectional view illustrating fabrication of a semiconductor, and showing formation of barrier, liner and conductive fill layers, planarization and cap layer formation according to an exemplary embodiment of the present invention.

Referring to FIG. 12, the trenches 224a and 224b and via opening 228 are lined with barrier and liner layers 226 and 227 the same as or similar to barrier and liner layers 206 and 207, and filled with electrically conductive fill layers 225, similar to fill layer 205. For example, the fill, barrier and liner layers 225, 226 and 227 can have the same material as or similar material to the fill, barrier and liner layers 205, 206 and 207.

The barrier and liner layers 226 and 227 are conformally formed on a top surface of the dielectric layer 221, and on sidewalls and bottom surfaces of the trenches 224a and 224b and via opening 228 including exposed surfaces of the etch stop layer 203 and dielectric layers 221 and 201, and on the exposed top surfaces of the interconnect in dielectric layer 201. The barrier and liner layers 226 and 227 are deposited using, for example, a conformal deposition technique, such as ALD or CVD. The fill layers 225 are deposited on the liner layer 127 using deposition techniques, including, but not necessarily limited to, PVD, CVD, ALD or sputtering.

Following deposition of the fill layers 225, a planarization process, such as, for example, chemical mechanical polishing (CMP), is performed to remove portions of the fill, barrier and liner layers 225, 226 and 227 on the top surface of the dielectric layer 221 and extending out of the trenches 224a and 224b to planarize an upper surface of the device.

Following planarization, cap layers 237 including the same material as or material similar to the liner layers 207 and 227 (e.g., Co and/or Ru), are selectively deposited on the top surfaces of the fill and liner layers 225 and 227. The cap layers are deposited using, for example, area-selective deposition techniques including, but not necessarily limited to, CVD.

Figure 13:
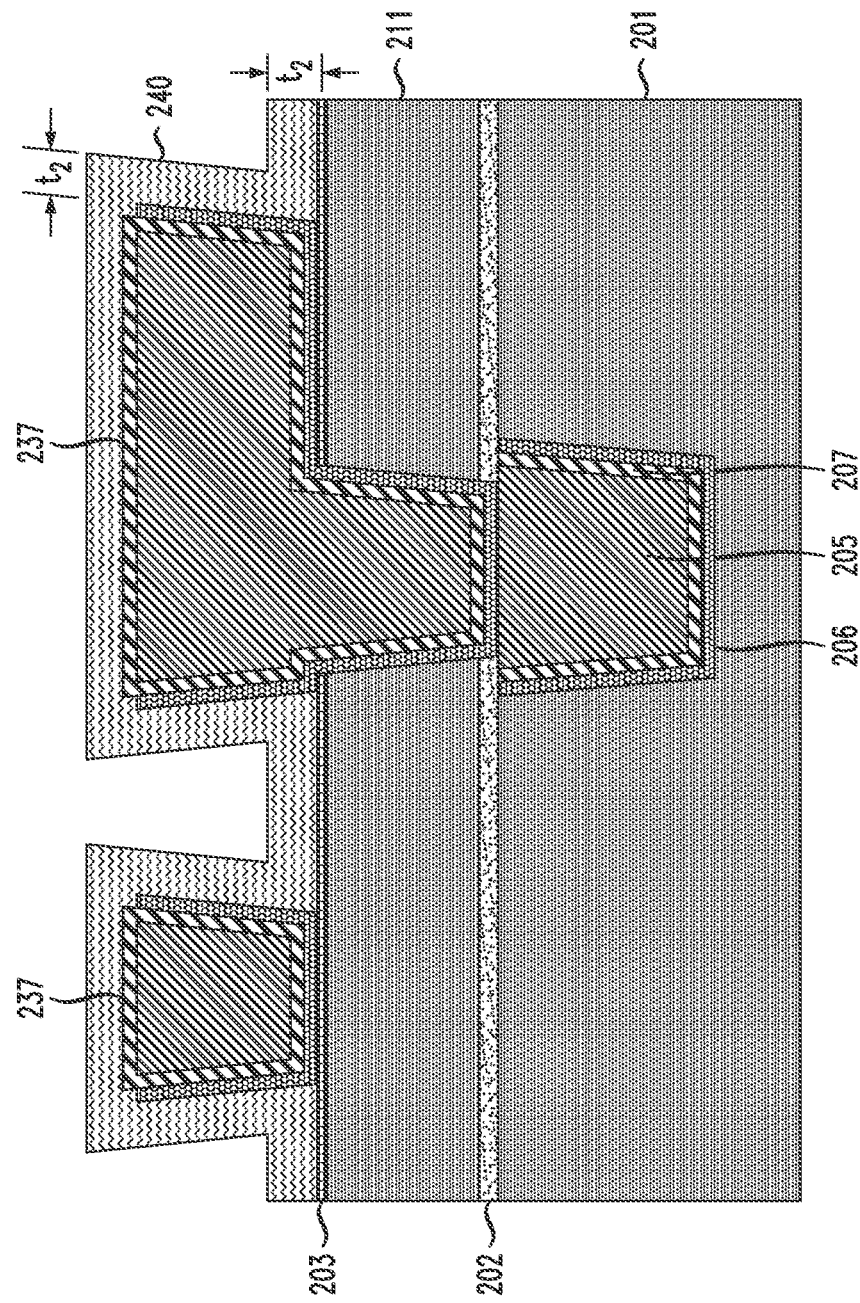
FIG. 13 is a cross-sectional view illustrating fabrication of a semiconductor device, and showing dielectric layer removal and sacrificial spacer layer formation, according to an exemplary embodiment of the present invention.

Referring to FIG. 13, following deposition of the cap layers 237, remaining portions of the dielectric layer 221 are removed using the same or a similar etch process as that described in connection with the removal of portions of the dielectric layer 221 to form the trenches 224a and 224b. The removal of the remaining portions of the dielectric layer 221 exposes portions of the etch stop layer 203 that were under the dielectric layer 221. Following etching of the dielectric layer 221, a sacrificial spacer layer 240 is conformally deposited on the exposed portions of the etch stop layer 203, and on sides and top surfaces of the interconnect structures including the fill, barrier, liner and cap layers 225, 226, 227 and 237. The conformal deposition process includes, for example, ALD or CVD. The material of the sacrificial spacer layer 240 includes, but is not necessarily limited to, the same or similar material to that of the sacrificial spacer layer 140. The thickness t2 of the spacer layer 240 can be precisely controlled. For example, according to embodiments, the thickness of the sacrificial spacer layer 240 is about 0.1 to less than about 0.5 of the distance between adjacent metal wires (e.g., interconnect structures including the fill, barrier, liner and cap layers 225, 226, 227 and 237), but the embodiments are not necessarily limited thereto. As described in more detail in connection with FIGS. 15-18, the thickness of the sacrificial spacer layer 240, which masks portions of the etch stop layer 203 during etching of the etch stop layer 203, controls resulting spacing between remaining portions of the etch stop layer 203, which form the two metal portions of the anti-fuse structure. The two metal portions respectively extend laterally from adjacent metal wires.

Figure 14:
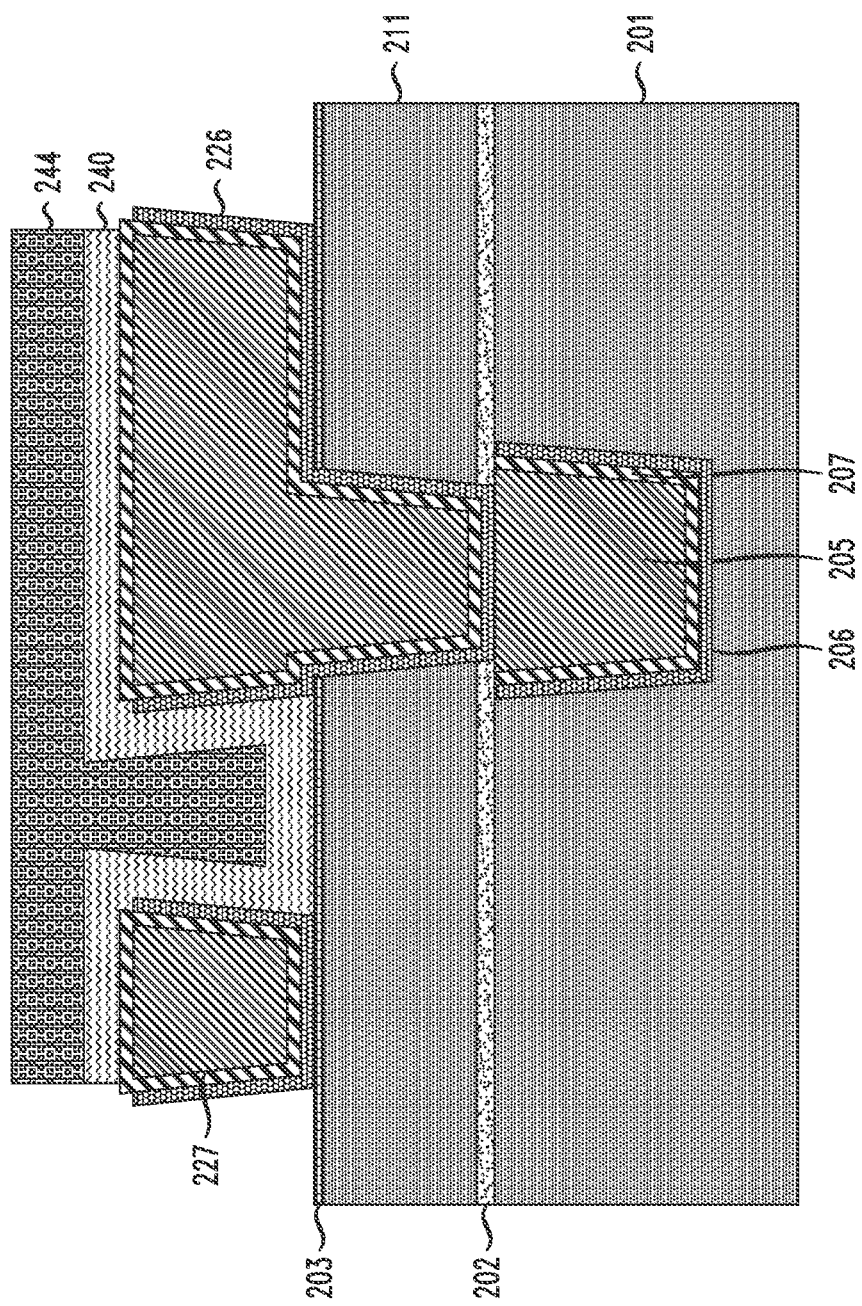
FIG. 14 is a cross-sectional view illustrating fabrication of a semiconductor device, and showing spacer block mask formation and removal of exposed portions of the sacrificial spacer layer, according to an exemplary embodiment of the present invention.

Referring to FIG. 14, a spacer block mask 244 is formed on a portion of the sacrificial spacer layer 240 between two neighboring interconnect structures and on top of part of the two interconnect structures. The spacer block mask 244 comprises, for example, an OPL material. The spacer block mask 244 can be deposited, for example, by spin coating.

Following deposition of the spacer block mask 244, exposed portions of the sacrificial spacer layer 240 not covered by the spacer block mask 244 are removed, leaving exposed portions of the etch stop layer 203, and portions of the barrier and cap layers 226 and 237. The removal of the exposed portions sacrificial spacer layer 240 not masked by the spacer block mask 244 can be performed using, for example, a chlorine-based etch for a sacrificial spacer layer 240 comprising TiN, or a fluorocarbon-based etch for a sacrificial spacer layer 240 comprising $SiO_2$.

Figure 15:
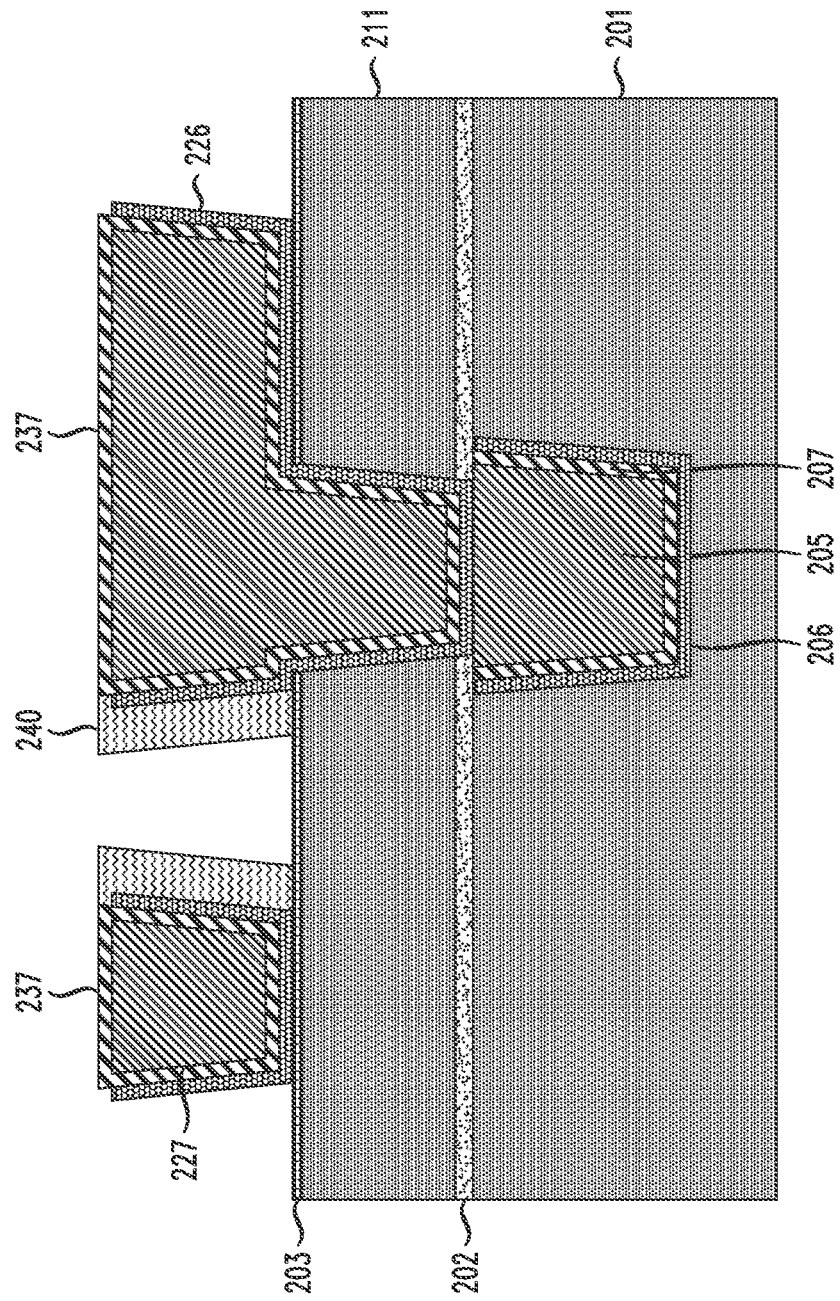
FIG. 15 is a cross-sectional view illustrating fabrication of a semiconductor device, and showing spacer block mask removal, and removal of portions of the sacrificial spacer layer, according to an exemplary embodiment of the present invention.

Referring to FIG. 15, the spacer block mask 244 is removed, and horizontal portions of the sacrificial spacer layer 240 are removed. The spacer block mask 244, which includes OPL material, is removed using, for example, oxygen plasma, nitrogen plasma, hydrogen plasma or other carbon strip or ashing process. Following removal of the spacer block mask 244, horizontal portions of the sacrificial spacer layer 240 are removed in a directional etching process using, for example, a dry etch process, such as a fluorocarbon-based etch. As can be seen in FIG. 15, the remaining portions of the sacrificial spacer layer 240 not removed by the directional etching cover parts of the etch stop layer 203 extending from and located between two neighboring interconnect structures (metal lines).

Figure 16:
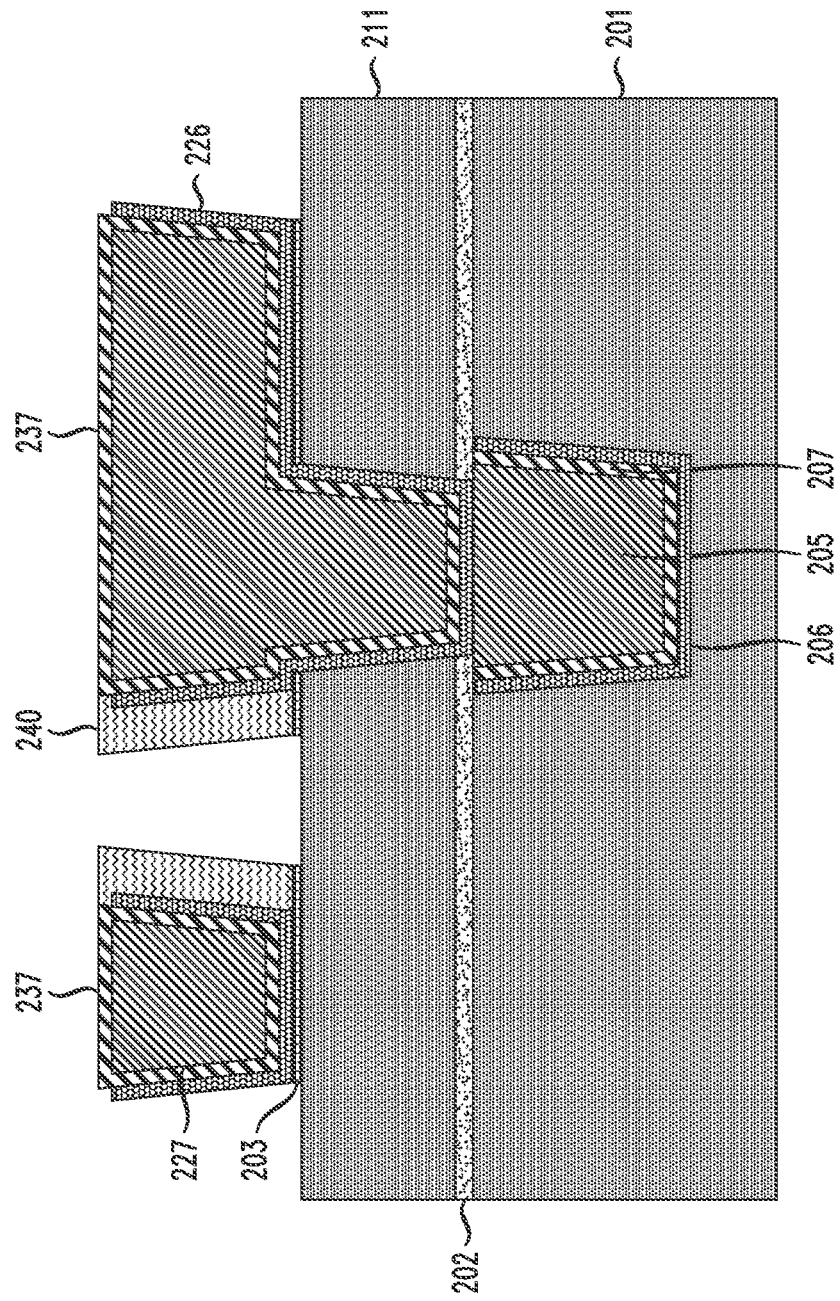
FIG. 16 is a cross-sectional view illustrating fabrication of a semiconductor device, and showing removal of exposed portions of the etch stop layer, according to an exemplary embodiment of the present invention.
Figure 17:
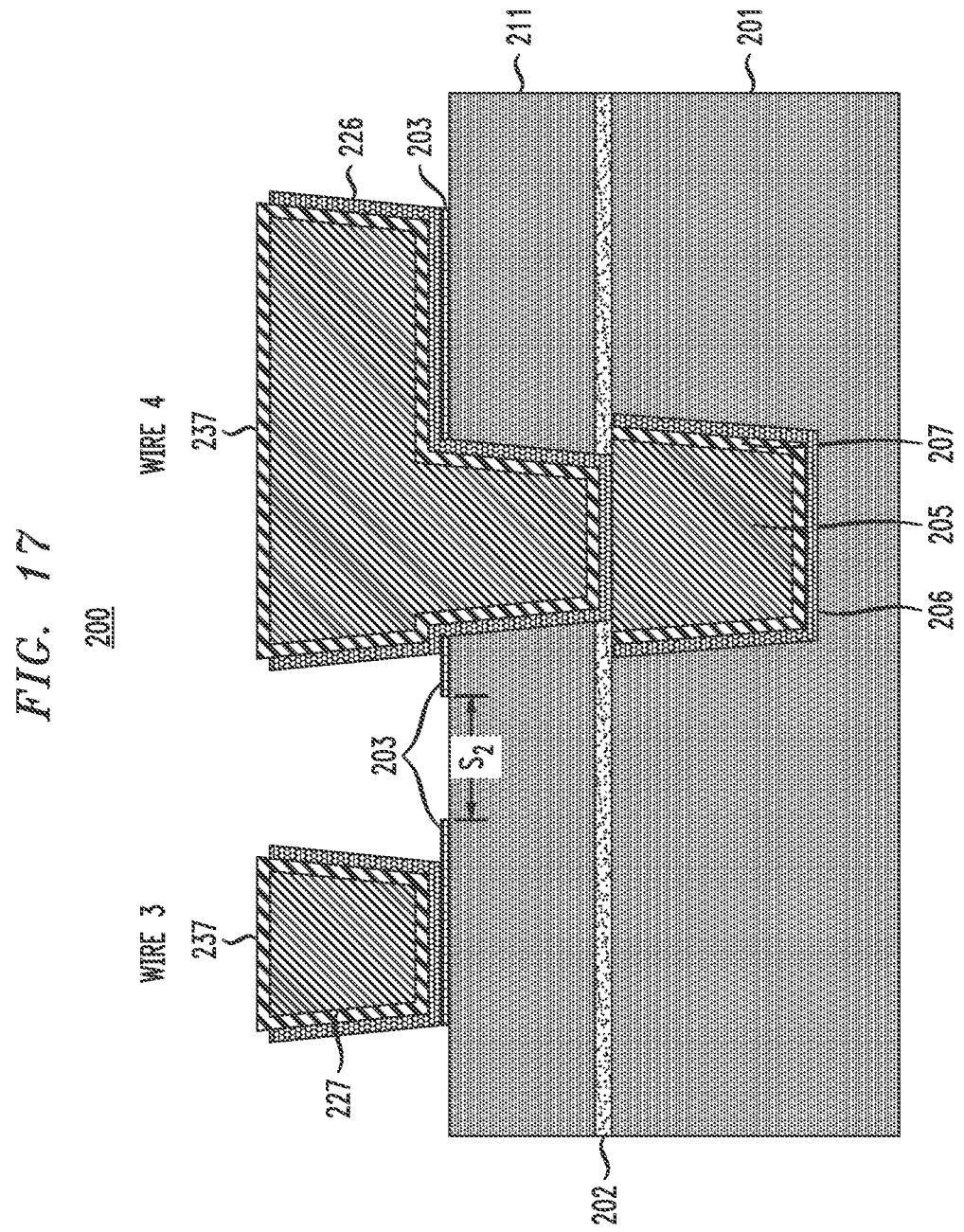
FIG. 17 is a cross-sectional view illustrating fabrication of a semiconductor device, and showing removal of remaining portions of the sacrificial spacer layer, according to an exemplary embodiment of the present invention.

Referring to FIG. 16, exposed portions of the etch stop layer 203 are removed using, for example, a directional etching process with a chlorine-based plasma. The portions of the etch stop layer 203 covered by the remaining portions of the sacrificial spacer layer 240, and under the interconnect structures are not removed. Then, referring to FIG. 17, the remaining portions of the sacrificial spacer layer 240 are removed using, for example, a chlorine-based etch for a sacrificial spacer layer 240 comprising TiN, or a fluorocarbon-based etch for a sacrificial spacer layer 240 comprising $SiO_2$. The remaining portions of the etch stop layer 203 extending between the interconnect structures Wire 3 and Wire 4 form the two metal portions of the anti-fuse structure. The two metal portions (extending portions of the etch stop layer 203) respectively extend laterally from adjacent metal wires Wire 3 and Wire 4. The thickness t2 of the sacrificial spacer layer 240 controls resulting spacing S between the extending portions of the etch stop layer 203. For example, if the distance between the adjacent metal wires Wire 3 and Wire 4 is 10 nm, and a thickness of the sacrificial spacer layer is 3 nm (0.3(10 nm)), then each extending portion of the etch stop layer 203 would be 3 nm, with a space $S_2$ of 4 nm between the extending portions of the etch stop layer 203.

Figure 18:
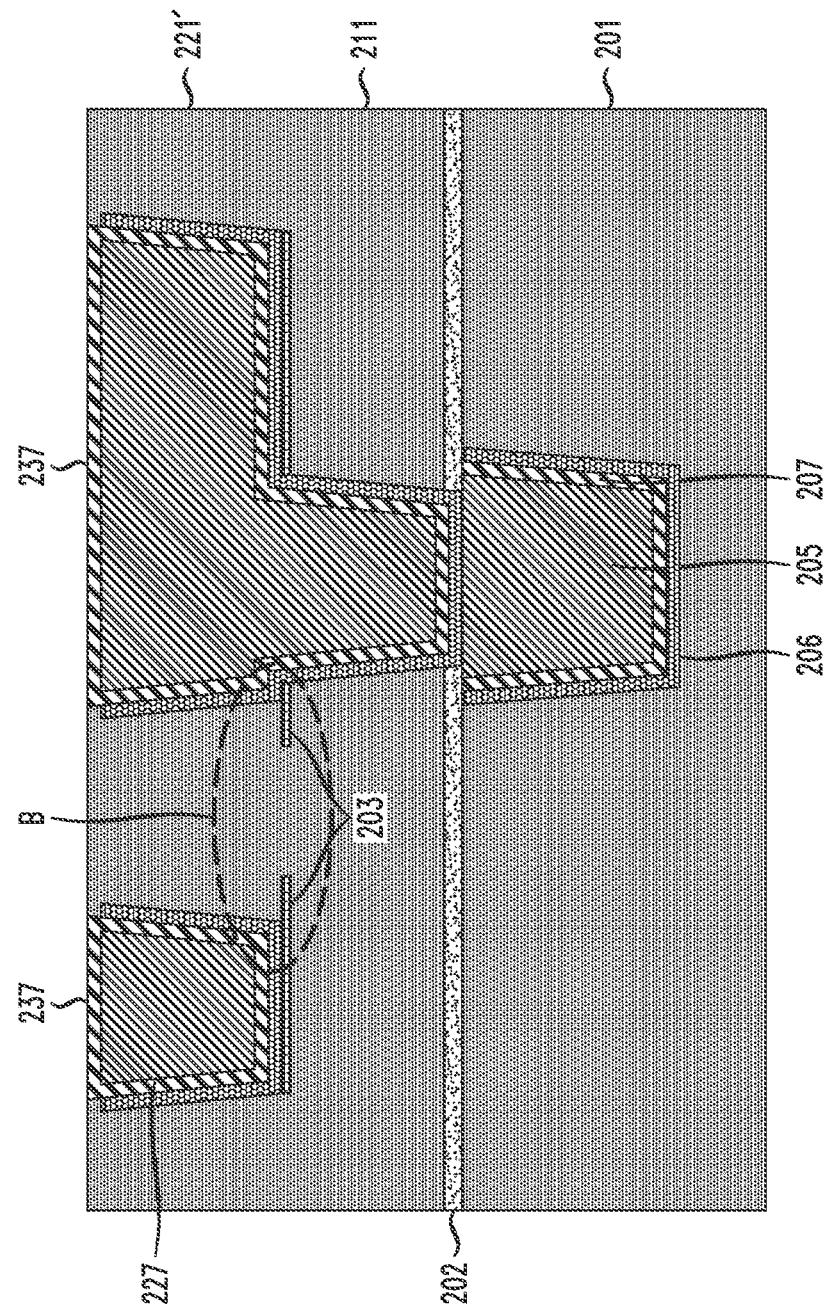
FIG. 18 is a cross-sectional view illustrating fabrication of a semiconductor device, and showing dielectric layer formation and planarization, according to an exemplary embodiment of the present invention.

Referring to FIG. 18, a dielectric layer 221' is formed on the dielectric layer 211 to replace the removed dielectric layer 221 and fills in gaps between the interconnect structures including the fill, barrier, liner and cap layers 225, 226, 227 and 237, and remaining portions of the etch stop layer 203. According to an embodiment, the dielectric layer 221' comprises the same or similar material as that of the dielectric layers 201, 211 and 221. The dielectric layer 221' is deposited using, for example, PVD, CVD, ALD, PECVD, RFCVD, MLD, MBD, LSMCD, and/or sputtering, followed by a planarization, such as, for example, CMP to planarize the dielectric layer 221' with the cap layers 237.

As shown by the circled portion B, the extending portions of the etch stop layer 203, which face each other with the space $S_2$ between their ends, function as the point where an anti-fuse is prone to be formed. For example, upon application a threshold voltage, the portion of the dielectric layer 221' between the ends of the extending portions of the etch stop layer 203 breaks down to form an electrically conductive path between the adjacent interconnect structures Wire 3 and Wire 4. The interconnect structures Wire 3 and Wire 4 and the dielectric layer 221' can form at least part of an upper metallization level ($M_{x+1}$). The via formed in the dielectric layer 211 below the interconnect structure Wire 4 connects the interconnect structure Wire 4 to the interconnect structure in the dielectric layer 201.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:
1. A method for manufacturing a semiconductor device, comprising:
   forming a first interconnect structure on an etch stop layer;
   forming a second interconnect structure on the etch stop layer and spaced apart from the first interconnect structure, wherein the etch stop layer extends between the first and second interconnect structures;

removing part of the etch stop layer between the first and second interconnect structures, wherein the removing forms a first portion of the etch stop layer extending from under the first interconnect structure toward the second interconnect structure, and a second portion of the etch stop layer extending from under the second interconnect structure toward the first interconnect structure, and wherein the first and second portions of the etch stop layer are spaced apart from each other; and forming a dielectric layer filling in the space between the first and second portions of the etch stop layer and the space between the first and second interconnect structures.

2. The method according to claim 1, wherein removing the part of the etch stop layer between the first and second interconnect structures comprises:

forming a sacrificial spacer layer on and around the first and second interconnect structures and on exposed portions of the etch stop layer;

forming a block mask on part of the sacrificial spacer layer; and removing an exposed portion of the sacrificial spacer layer.

3. The method according to claim 2, wherein the part of the sacrificial spacer layer on which the block mask is formed is at least between the first and second interconnect structures.

4. The method according to claim 2, wherein the block mask comprises an organic planarization layer.

5. The method according to claim 2, wherein removing the part of the etch stop layer between the first and second interconnect structures further comprises:

removing the block mask to expose the sacrificial spacer layer; and removing a portion of the exposed sacrificial spacer layer between the first and second interconnect structures to expose the part of the etch stop layer between the first and second interconnect structures.

6. The method according to claim 5, wherein removing the part of the etch stop layer between the first and second interconnect structures further comprises using a remaining portion of the exposed sacrificial spacer layer as a mask during the removing of the part of the etch stop layer between the first and second interconnect structures.

7. The method according to claim 6, further comprising removing the remaining portion of the sacrificial spacer layer.

8. The method according to claim 1, wherein the etch stop layer is formed on an additional dielectric layer.

9. The method according to claim 1, wherein the first and second interconnect structures comprise a conductive fill layer.

10. The method according to claim 1, wherein the etch stop layer comprises a conductive material.

11. The method according to claim 10, wherein the etch stop layer comprises one of tantalum (Ta), tantalum nitride (TaN), Ta/TaN, Ta/Ruthenium (Ru), Ta/Cobalt (Co), TaN/Ru, TaN/Co, Ta/TaN/Ru, and Ta/TaN/Co.

12. The method according to claim 1, wherein the first and second portions of the etch stop layer and the dielectric layer filling in the space between the first and second portions of the etch stop layer comprise an anti-fuse structure.

13. The method according to claim 1, further comprising forming a via under and in contact with one of the first and second interconnect structures.

14. A method for manufacturing a semiconductor device, comprising:

forming a first interconnect structure on a conductive layer;

forming a second interconnect structure on the conductive layer and spaced apart from the first interconnect structure, wherein the conductive layer extends between the first and second interconnect structures;

removing part of the conductive layer between the first and second interconnect structures, wherein the removing forms a first portion of the conductive layer extending from under the first interconnect structure toward the second interconnect structure, and a second portion of the conductive layer extending from under the second interconnect structure toward the first interconnect structure, and wherein the first and second portions of the conductive layer are spaced apart from each other; and forming a dielectric layer filling in the space between the first and second portions of the conductive layer and the space between the first and second interconnect structures.

15. The method according to claim 14, wherein removing the part of the conductive layer between the first and second interconnect structures comprises:

forming a sacrificial spacer layer on and around the first and second interconnect structures and on exposed portions of the conductive layer;

forming a block mask on part of the sacrificial spacer layer; and removing an exposed portion of the sacrificial spacer layer.

* * * * *